United States Patent
Seo et al.

(10) Patent No.: US 8,647,914 B2
(45) Date of Patent: Feb. 11, 2014

(54) SOLAR CELL AND METHOD OF FABRICATING THE SAME

(75) Inventors: Kyoung-Jin Seo, Yongin-si (KR); Yoon-Mook Kang, Yongin-si (KR); Min-Chul Song, Yongin-si (KR); Dong-Chul Suh, Suwon-si (KR); Ju-Hee Song, Yongin-si (KR)

(73) Assignees: Samsung SDI Co., Ltd., Yongin-si (KR); Samsung Display Co., Ltd., Yongin-si (KR)

( * ) Notice: Subject to any disclaimer, the term of this patent is extended or adjusted under 35 U.S.C. 154(b) by 165 days.

(21) Appl. No.: 13/242,787

(22) Filed: Sep. 23, 2011

(65) Prior Publication Data

US 2012/0247548 A1 Oct. 4, 2012

(30) Foreign Application Priority Data

Mar. 31, 2011 (KR) ........................ 10-2011-0029811

(51) Int. Cl.
*H01L 31/18* (2006.01)
*H01L 31/0216* (2006.01)

(52) U.S. Cl.
USPC ...... 438/72; 136/256; 136/259; 257/E31.117; 257/E31.119

(58) Field of Classification Search
USPC .............................. 438/57, 72; 136/256, 259; 257/E31.117, E31.119
See application file for complete search history.

(56) References Cited

U.S. PATENT DOCUMENTS

| | | | | |
|---|---|---|---|---|
| 4,431,858 A | * | 2/1984 | Gonzalez et al. | 136/258 |
| 8,071,418 B2 | * | 12/2011 | Rohatgi et al. | 438/87 |
| 8,203,072 B2 | * | 6/2012 | Ko et al. | 136/256 |
| 8,481,847 B2 | * | 7/2013 | Ko et al. | 136/256 |
| 8,507,789 B2 | * | 8/2013 | Ko et al. | 136/256 |
| 2006/0060238 A1 | * | 3/2006 | Hacke et al. | 136/256 |
| 2008/0271780 A1 | * | 11/2008 | Narayanan et al. | 136/255 |
| 2009/0320922 A1 | * | 12/2009 | Hacke et al. | 136/256 |
| 2010/0008501 A1 | * | 1/2010 | Iwasaki | 380/201 |
| 2010/0193016 A1 | * | 8/2010 | Fernandez et al. | 136/255 |
| 2010/0258177 A1 | * | 10/2010 | Ko et al. | 136/256 |
| 2010/0275965 A1 | * | 11/2010 | Lee et al. | 136/244 |
| 2011/0000530 A1 | * | 1/2011 | Mihailetchi | 136/255 |
| 2011/0094586 A1 | * | 4/2011 | Cheong et al. | 136/259 |

(Continued)

FOREIGN PATENT DOCUMENTS

| | | |
|---|---|---|
| JP | 2006-210385 A | 8/2003 |
| KR | 10-2009-0054734 A | 6/2009 |
| KR | 10-2009-0091562 A | 8/2009 |

OTHER PUBLICATIONS

"Laser Edge Isolation for High-efficiency Crystalline Silicon Solar Cells," Dohyeon Kyeong, et al., Journal of the Korean Physical Society, vol. 55, No. 1, Jul. 2009, pp. 124-128.

*Primary Examiner* — Mary Wilczewski
(74) *Attorney, Agent, or Firm* — Christie, Parker & Hale, LLP

(57) ABSTRACT

A method of fabricating a solar cell includes forming an emitter layer of a second conductive type on a front surface and a back surface of a substrate of a first conductive type opposite to the second conductive type, forming an anti-reflection layer on the front surface of the substrate, partially removing the anti-reflection layer and the emitter layer to form an isolation groove dividing the emitter layer into a plurality of regions, removing a portion of the emitter layer formed on the back surface of the substrate, and forming a passivation layer covering the isolation groove and the back surface of the substrate.

14 Claims, 7 Drawing Sheets

(56) References Cited

U.S. PATENT DOCUMENTS

| | | | |
|---|---|---|---|
| 2011/0100459 A1* | 5/2011 | Yoon et al. | 136/259 |
| 2011/0139229 A1* | 6/2011 | Rohatgi et al. | 136/255 |
| 2011/0139243 A1* | 6/2011 | Shim et al. | 136/259 |
| 2011/0308608 A1* | 12/2011 | Shim et al. | 136/258 |
| 2012/0006393 A1* | 1/2012 | Cruz et al. | 136/256 |
| 2012/0167968 A1* | 7/2012 | Lossen et al. | 136/255 |
| 2012/0222740 A1* | 9/2012 | Kim et al. | 136/259 |
| 2012/0227804 A1* | 9/2012 | Ko et al. | 136/256 |
| 2012/0247548 A1* | 10/2012 | Seo et al. | 136/256 |
| 2012/0264252 A1* | 10/2012 | Ko et al. | 438/72 |

\* cited by examiner

SOLAR CELL AND METHOD OF FABRICATING THE SAME

This application claims priority to Korean Patent Application No. 10-2011-0029811, filed on Mar. 31, 2011, and all the benefits accruing therefrom under 35 U.S.C. §119, the entire contents of which are hereby incorporated by reference.

BACKGROUND OF THE INVENTION (1) Field of the Invention

The disclosure herein relates to a solar cell and a method of fabricating the solar cell.

(2) Description of the Related Art

Solar cells use a photovoltaic effect to convert optical energy into electrical energy. Solar cells may be classified into silicon solar cells, thin film solar cells, dye-sensitized solar cells, and organic polymer solar cells, according to their materials. Solar cells are used as main or sub power sources for various electronic products, artificial satellites, and rockets.

Such a solar cell includes: a first semiconductor having a first conductive type, a substrate; and a second semiconductor disposed on the front surface of the first semiconductor and having a second conductive type opposite to the first conductive type. The first and second semiconductors form a p-n junction. Light is shed on the p-n junction to form pairs of electrons and holes in the first and second semiconductors. The holes and the electrons are moved by an electrical potential difference in the p-n junction, thereby generating electric current.

BRIEF SUMMARY OF THE INVENTION

The disclosure provides a high quality solar cell.

The disclosure also provides a simple and economic solar cell fabricating method.

Embodiments of the invention provide methods of fabricating a solar cell, including: preparing a substrate of a first conductive type; forming an emitter layer of a second conductive type opposite to the first conductive type on a front surface and on a back surface opposite the front surface of the substrate; forming an anti-reflection layer on the front surface of the substrate; partially removing the anti-reflection layer and the emitter layer on the front surface of the substrate to form an isolation groove dividing the emitter layer into a plurality of regions; removing a portion of the emitter layer formed on the back surface of the substrate; and forming a passivation layer in the isolation groove and covering the back surface of the substrate.

In an exemplary embodiment, the isolation groove may be adjacent to an end of the substrate in a plan view. The forming an isolation groove may include shedding laser beams on the anti-reflection layer and the emitter layer, to remove a portion of the anti-reflection layer and a portion of the emitter layer. The removing a portion of the emitter layer formed on the back surface of the substrate may include etching using the anti-reflection layer as a mask. The etching may be wet etching. The wet etching in the removing a portion of the emitter layer formed on the back surface of the substrate may etch a region of the emitter layer on the front surface of the substrate and adjacent to a region on which the laser beams are shed.

In an exemplary embodiment, the forming a front surface electrode may include: removing a portion of the anti-reflection layer to expose a portion of the emitter layer; printing metal paste on the exposed portion of the emitter layer; and curing the substrate including the metal paste to diffuse a metal of the metal paste.

In an exemplary embodiment, the forming a back surface electrode may include: removing a portion of the passivation layer to expose a portion of the substrate; forming metal paste on the exposed portion of the substrate; and curing the substrate including the metal paste to diffuse a metal of the metal paste.

Embodiments of the invention provide solar cells including: a substrate of a first conductive type and including a front surface which receives light and a back surface opposite to the front surface; an emitter layer of a second conductive type opposite to the first conductive type, on the substrate and including a first isolation groove where material of the emitter layer is absent; an anti-reflection layer on the emitter layer and including a second isolation groove where material of the anti-reflection layer is absent, the second isolation groove overlapping the first isolation groove; and a passivation layer, on the back surface of the substrate and the anti-reflection layer, and in contact with the front surface of the substrate through the first and second isolation grooves.

In an exemplary embodiment, the first and second isolation grooves are adjacent to an end of the substrate in a plan view.

BRIEF DESCRIPTION OF THE DRAWINGS

The accompanying figures are included to provide a further understanding of the invention, and are incorporated in and constitute a part of this specification. The drawings illustrate exemplary embodiments of the invention and, together with the description, serve to explain principles of the invention. In the figures.

DETAILED DESCRIPTION OF THE INVENTION

Figure 1:
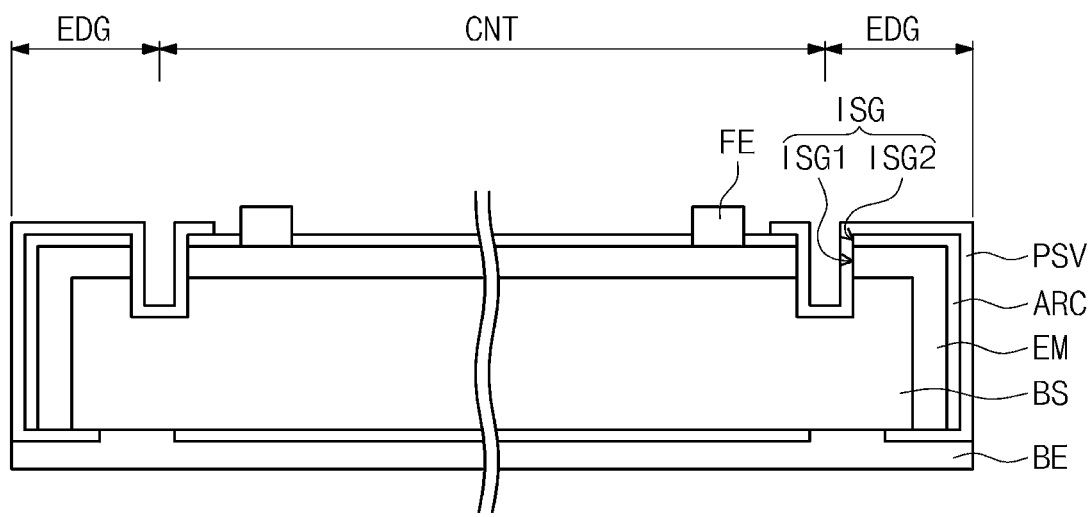
FIG. 1 is a cross-sectional view illustrating an exemplary embodiment of a solar cell according to the invention.

Since the invention may have diverse modified embodiments, exemplary embodiments are illustrated in the drawings and are described in the detailed description of the invention. However, this does not limit the invention within specific embodiments and it should be understood that the invention concept covers all the modifications, equivalents, and replacements within the idea and technical scope of the invention.

Like reference numerals refer to like elements throughout. In the drawings, the dimensions and size of each structure are exaggerated, omitted, or schematically illustrated for convenience in description and clarity. It will be understood that although the terms of first and second are used herein to describe various elements, these elements should not be limited by these terms. Terms are only used to distinguish one component from other components. Therefore, a component referred to as a first component in one embodiment can be referred to as a second component in another embodiment. The terms of a singular form may include plural forms unless referred to the contrary.

The meaning of 'comprise', 'include', or 'have' specifies a property, a region, a fixed number, a step, a process, an element and/or a component but does not exclude other properties, regions, fixed numbers, steps, processes, elements and/or components. In the specification, it will be understood that when a layer (or film), a region, or a plate is referred to as being 'on' another layer, region, or plate, it can be directly on the other layer, region, or plate, or intervening layers, regions, or plates may also be present. In the specification, it will be understood that when a layer (or film), a region, or a plate is referred to as being 'under' another layer, region, or plate, it can be directly under the other layer, region, or plate, or intervening layers, regions, or plates may also be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 is a cross-sectional view illustrating an exemplary embodiment of a solar cell according to the invention.

Referring to FIG. 1, the solar cell includes a base substrate BS of a first conductive type, an emitter layer EM of a second conductive type opposite to the first conductive type, an anti-reflection layer ARC on the emitter layer EM, and a passivation layer PSV on the anti-reflection layer ARC.

The solar cell is provided in a plate-like shape. From a plan view, a region including an end edge and portions adjacent to the end edge is referred to as an edge region EDG, and a region surrounded by the edge region EDG is referred to as a central region CNT.

The base substrate BS is a first conductive type semiconductor layer. The base substrate BS may include single crystalline silicon or polycrystalline silicon. The base substrate BS has a plate-like shape, which has a front surface, a back surface opposed to the front surface, and side surfaces connecting the front and back surfaces. The front and back surfaces are the largest surfaces among the surfaces of the base substrate BS.

The front surface may include a texture which forms a convex-concave structure thereon, and the texture may be formed thereon such as through a texturing process. Also, the back surface may include a texture which forms a convex-concave structure thereon and may be formed thereon such as through a texturing process. The convex-concave structure may have a plurality of recesses recessed from the front surface or the back surface, and extended into an interior of the base substrate BS. In one exemplary embodiment, for example, the convex-concave surface may have a pattern with regularly arrayed reverse-pyramid shapes. The convex-concave surface is provided to increase a surface area contacting external light and thereby improve the absorption of light.

The emitter layer EM is on the base substrate BS and contacts the base substrate BS. The emitter layer EM covers (e.g., overlaps) the front and side surfaces of the base substrate BS. The emitter layer EM includes a first isolation groove ISG1 where a portion of the emitter layer EM is absent, in the region adjacent to the end of the base substrate BS, that is, in the edge region EDG.

A portion of the base substrate BS is exposed through the first isolation groove ISG1 in the edge region EDG. The base substrate BS may include a recess where a portion of the base substrate BS is absent, and the recess corresponds to (e.g., is aligned with) the first isolation groove ISG1 in the emitter layer EM. The emitter layer EM is divided into a plurality of portions that are insulated from each other with the first isolation groove ISG1 between portions. In the illustrated embodiment, the emitter layer EM is divided into a first portion and a second portion with the first isolation groove ISG1 therebetween. The first portion corresponds to the central region CNT, and the second portion corresponds to the edge region EDG and the side surfaces of the base substrate BS.

The emitter layer EM may include single crystalline silicon or polycrystalline silicon. The emitter layer EM is a semiconductor layer of the second conductive type opposite to the first conductive type, and forms a p-n junction with the base substrate BS. That is, when the base substrate BS is an n-type substrate, and the emitter layer EM is a p-type layer. Alternatively, the base substrate BS is a p-type substrate, and the emitter layer EM is an n-type layer. In the illustrated embodiment, the base substrate BS is a p-type substrate, and the emitter layer EM is an n-type layer. The emitter layer EM may be doped with second conductive type impurities, such as phosphor (P), at a high concentration.

The anti-reflection layer ARC is on the emitter layer EM. The anti-reflection layer ARC includes an electrically insulating material. The anti-reflection layer ARC may include at least one of silicon oxide, silicon nitride, and silicon oxynitride. The anti-reflection layer ARC may be a single film or a multi film element including at least one of the above described materials. The anti-reflection layer ARC protects the emitter layer EM and prevents reflection of the light from a surface of the emitter layer EM.

From a plan view, the anti-reflection layer ARC includes a second isolation groove ISG2 where a portion of the anti-reflection layer ARC in absent the edge region EDG. The second isolation groove ISG2 is in a region corresponding to (e.g., aligned with) the first isolation groove ISG1, and overlaps the first isolation groove ISG1. Accordingly, the base substrate BS is partially exposed through the first and second isolation grooves ISG1 and ISG2.

The passivation layer PSV is on the anti-reflection layer ARC in a region corresponding to the edge region EDG and on the side surfaces of the base substrate BS. In the region corresponding to the edge region EDG, the passivation layer PSV contacts the front surface of the base substrate BS through the first and second isolation grooves ISG1 and ISG2. The passivation layer PSV covers a portion of the anti-reflection layer ARC adjacent to the first and second isolation grooves ISG1 and ISG2, extends past a region corresponding to the first and second isolation grooves ISG1 and ISG2, and extends to the central region CNT. Accordingly, the passivation layer PSV covers the front surface of the base substrate BS and side surfaces of the emitter layer EM exposed through the first and second isolation grooves ISG1 and ISG2 to protect the front surface of the base substrate BS and the emitter layer EM.

The passivation layer PSV covers a portion of the back surface of the base substrate BS to protect the back surface of the base substrate BS.

The passivation layer PSV may be a single or multi film including at least one of aluminum oxide ($AlO_x$), aluminum nitride (AlN), silicon oxide ($SiO_x$), silicon nitride ($SiN_x$), and silicon oxynitride SiON.

A front surface electrode FE contacts the emitter layer EM and portions of the anti-reflection layer ARC. A back surface electrode BE contacts the back surface of the base substrate BS and a back surface of a portion of the passivation layer PSV facing the back surface of the base substrate BS.

A portion of the anti-reflection layer ARC is absent to expose a portion of the front surface of the emitter layer EM in the first portion, and the exposed portion of the emitter layer EM contacts the front surface electrode FE. The front surface electrode FE may include a metal such as silver, aluminum, or an alloy thereof.

A portion of the passivation layer PSV is absent to expose a portion of the back surface of the base substrate BS, and the exposed portion of the base substrate BS contacts the back surface electrode BE. The back surface electrode BE may include a metal such as silver, aluminum, or an alloy thereof. Although not shown in FIG. 1, a back surface field layer doped with first conductive type impurities at high density may be between the base substrate BS and the back surface electrode BE.

The solar cell configured as described above receives light such as sunlight to form pairs of electrons and holes in the base substrate BS and the emitter layer EM. The electrons move to an n-type semiconductor, and the holes move to a p-type semiconductor, thereby generating power. In one exemplary embodiment, for example, when the base substrate BS and the emitter layer EM include an n-type semiconductor and a p-type semiconductor, respectively, the electrons and the holes move to the back surface electrode BE and the front surface electrode FE, respectively, thereby generating electric current.

Hereinafter, an exemplary embodiment of a solar cell fabricating method will now be described according to the invention.

FIGS. 2A to 2G are cross-sectional views sequentially illustrating an exemplary embodiment of a solar cell fabricating method according to the invention.

Figure 2A:
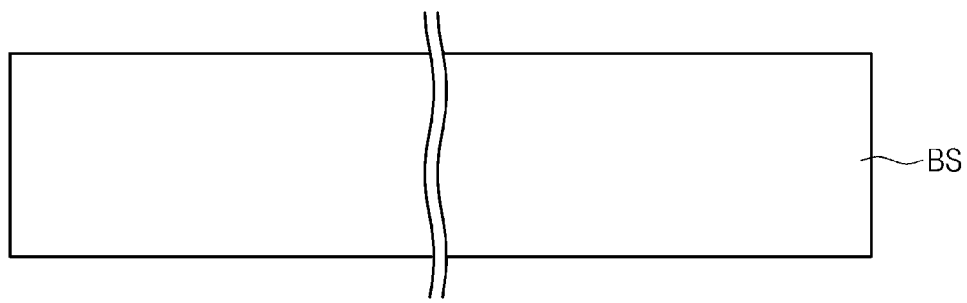
FIGS. 2A to 2G are cross-sectional views sequentially illustrating an exemplary embodiment of a solar cell fabricating method according to the invention.

First, referring to FIG. 2A, the first conductive type base substrate BS is prepared. The base substrate BS may be a substrate including single crystalline silicon or polycrystalline silicon. The first conductive type of the base substrate BS may be one of the p-type and the n-type. The base substrate BS may be cleaned to remove foreign substances therefrom. The base substrate BS may have a plate shape with front and back surfaces.

Although not shown, the front and back surfaces of the base substrate BS may include a convex-concave structure, that is, a structure of protrusions and recesses formed through a texturing process. In one exemplary embodiment, for example, the convex-concave structure may include recesses having reverse-pyramid shapes, but is not limited thereto. The convex-concave structure may be formed using a plasma etching method, a mechanical scribing method, a photolithography method, or a chemical etching method.

Figure 2B:
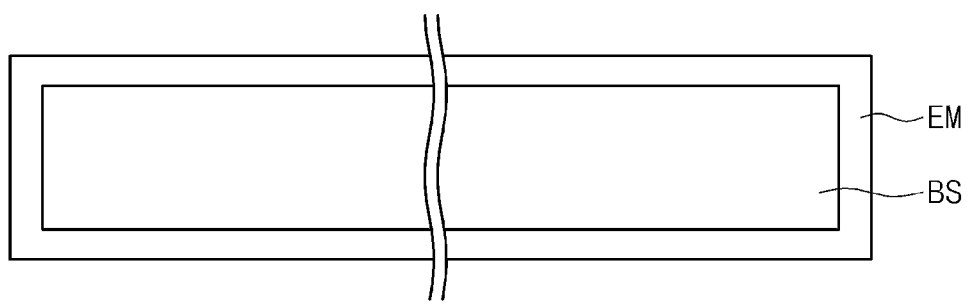

Then, referring to FIG. 2B, the emitter layer EM is formed directly on the base substrate BS. The emitter layer EM may be doped with second conductive type impurities opposite to the first conductive type impurities. That is, when the base substrate BS is a p-type conductive type substrate as described above, the emitter layer EM is an n-type conductive type layer. In contrast, when the base substrate BS is an n-type conductive type substrate, the emitter layer EM is a p-type conductive type layer.

The emitter layer EM may be formed using a thermal diffusion method, a spray method, or a printing method. In the illustrate embodiment, the thermal diffusion method is used. According to the thermal diffusion method, the emitter layer EM is formed by diffusing a second conductive type material into the first conductive type base substrate BS. In one exemplary embodiment, for example, when the base substrate BS is a p-type substrate, the base substrate BS may be put into a furnace at high temperature, and an n-type material such as a material including phosphor (P) may be injected into the base substrate BS to form the emitter layer EM. The material including phosphor (P) may be phosphoryl chloride ($POCl_3$). When the base substrate BS is an n-type substrate, the base substrate BS may be put into a furnace at high temperature, and a p-type material such as a material including boron (B) may be injected into the base substrate BS to form the emitter layer EM. The material including boron (B) may be boron tribromide ($BBr_3$).

Instead of the thermal diffusion method, an ion implantation method may be used to directly inject impurities into the base substrate BS, thereby forming the emitter layer EM. In this case, when the base substrate BS is exposed to vapor including phosphoryl chloride or boron tribromide, an unexpected dielectric such as phosphorus silicate glass ("PSG") or boron silicate glass ("BSG") may be formed on the base substrate BS. The dielectric may be etched with a predetermined etching agent before a subsequent process.

Figure 2C:
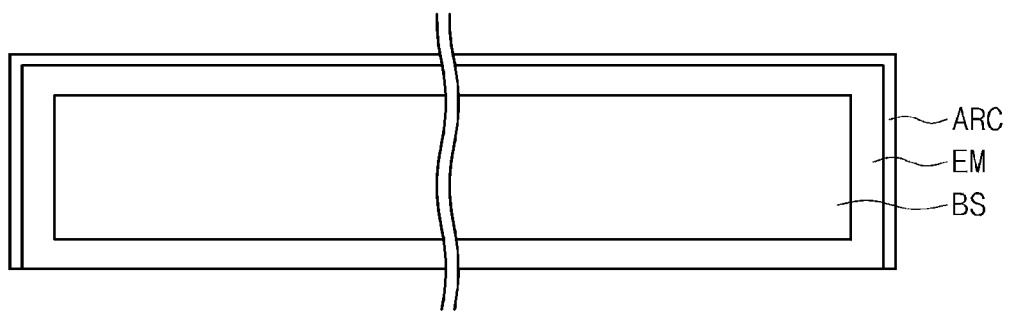

Then, referring to FIG. 2C, the anti-reflection layer ARC is formed directly on the emitter layer EM except for the portion on the back surface of the base substrate BS. That is, the anti-reflection layer ARC is formed on the portions of the emitter layer EM on the front and sides surfaces of the base substrate BS. The anti-reflection layer ARC may include a dielectric material and be formed using a chemical vapor deposition method. The anti-reflection layer ARC may include at least one of silicon oxide, silicon nitride, and silicon oxynitride. The anti-reflection layer ARC may a single film or a multi film including at least one of the above described materials.

Figure 2D:
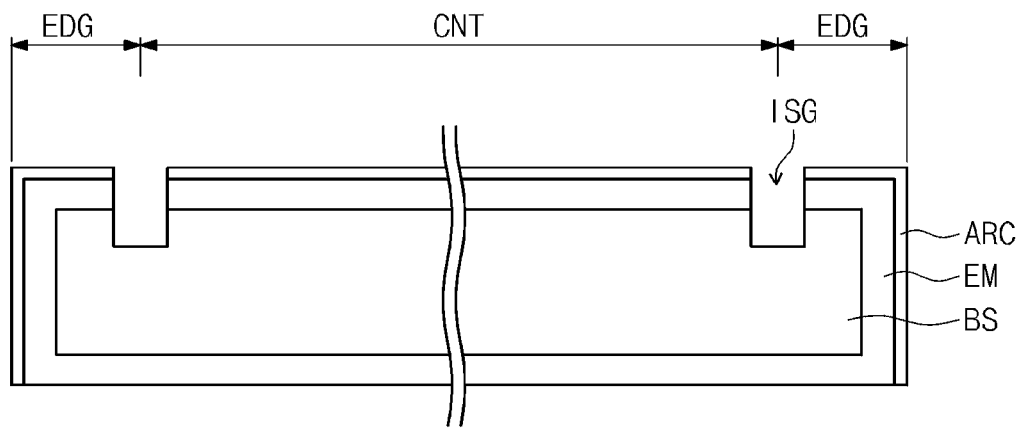

Then, referring to FIG. 2D, an isolation groove ISG is formed to isolate the edge region EDG from the central region CNT. From a plan view, the isolation groove ISG is adjacent to the end of the base substrate BS. The isolation groove ISG may be formed by shedding laser beams on portions of the anti-reflection layer ARC and the emitter layer EM, and removing the portions. The laser beams may be any laser beams for partially removing the anti-reflection layer ARC and the emitter layer EM. In one exemplary embodiment, for example, the laser beams may be fiber laser beams having a wavelength of about 1064 nanometers (nm). Since an edge of the base substrate BS is isolated to form the isolation groove ISG, the forming of the isolation groove ISG may be called an edge isolation process.

The isolation groove ISG divides the emitter layer EM into a plurality of regions. In the illustrated embodiment, the isolation groove ISG divides the emitter layer EM into the first portion and the second portion. When the emitter layer EM is formed using the thermal diffusion method, the impurities are diffused or injected into the front, back, and side surfaces of the base substrate BS to form the emitter layer EM covering the entire surface of the base substrate BS. Accordingly, the front and back surfaces of the base substrate BS are electrically connected to each other. This may degrade photovoltaic efficiency of the completed solar cell. Thus, it is necessary to insulate the back surface of the emitter layer EM from the rest of the emitter layer EM.

Since the edge region EDG, adjacent to the edge of the base substrate BS, is different in shape from the central region CNT of the base substrate BS, a defect rate is increased in the edge region EDG during processes for fabricating the solar cell. In one exemplary embodiment, for example, due to an air flow in the region adjacent to the edge region EDG, the central region CNT and the edge region EDG may be different in doping amount of the impurities. Thus, the edge region EDG is electrically and mechanically isolated from the central region CNT of the base substrate BS, thereby reducing a defect rate of the solar cell.

The isolation groove ISG has a sufficient depth to expose the base substrate BS. Since a portion of the anti-reflection layer ARC and the emitter layer EM adjacent to the isolation groove ISG is molten by the laser beams, and then, is harden, the hardened portion may have different physical properties from those of portions of the anti-reflection layer ARC and the emitter layer EM in the central region CNT. Hereinafter, the portion having the different physical properties by the laser beams will now be called a damage region.

Figure 2E:
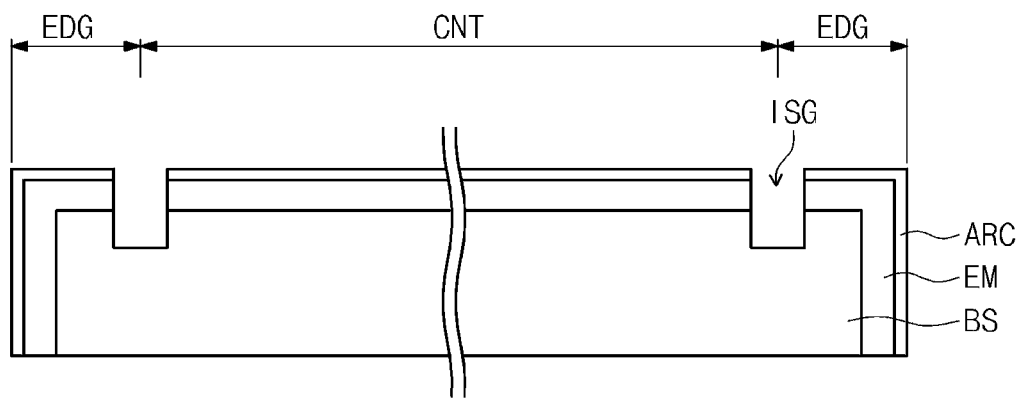

Then, referring to FIG. 2E, the emitter layer EM formed on the back surface of the base substrate BS is removed using the anti-reflection layer ARC as a mask. The emitter layer EM may be removed using wet etching. In this case, the region adjacent to the portions on which the laser beam is shed, that is, the portion of the anti-reflection layer ARC and the emitter layer EM adjacent to the isolation groove ISG are also etched. Accordingly, the damage region formed by the laser beams is etched together with the portion of the emitter layer EM formed on the back surface of the base substrate BS, at substantially a same time. As such, without a separate process for removing the damage region, the damage region can be removed during the wet etching for partially removing the emitter layer EM, and thus, the process of fabricating the solar cell is simplified.

Figure 2F:
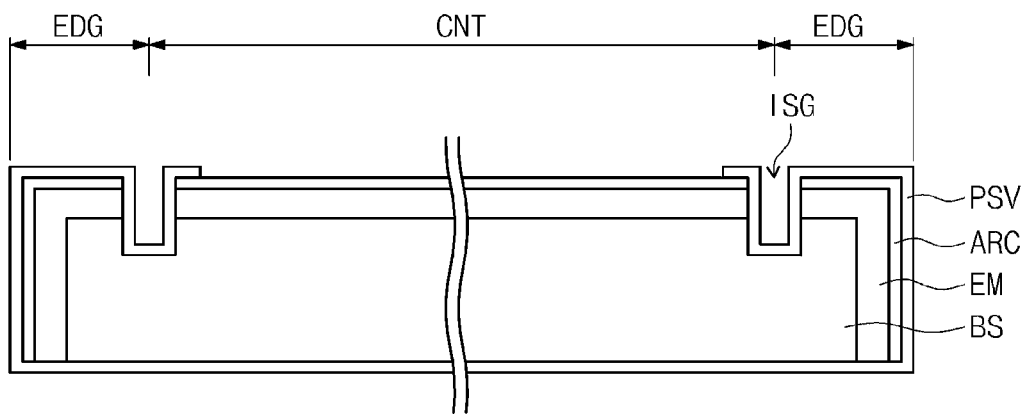

Subsequently, referring to FIG. 2F, the passivation layer PSV, covering the isolation groove ISG and the back surface of the base substrate BS, is formed. The passivation layer PSV covers the isolation groove ISG, and covers an upper surface of the anti-reflection layer ARC in the edge region EDG. The passivation layer PSV contacts exposed portions of the base substrate BS, the anti-reflection layer ARC and the emitter layer EM through the isolation groove ISG. The passivation layer PSV is further on the upper surface of the anti-reflection layer ARC and extends from the isolation groove ISG toward the central region CNT to sufficiently cover the isolation groove ISG.

The passivation layer PSV may be formed by depositing at least two of aluminum oxide ($AlO_x$), aluminum nitride (AlN), silicon oxide ($SiO_x$), silicon nitride ($SiN_x$), and silicon oxynitride (SiON). The passivation layer PSV covers the portions of the anti-reflection layer ARC and the emitter layer EM provided in the isolation groove ISG to prevent an oxide from being formed on surfaces of the covered portions. Particularly, since the passivation layer PSV covers the emitter layer EM, damage that would otherwise be generated in a subsequent high temperature process can be reduced or effectively prevented.

Figure 2G:
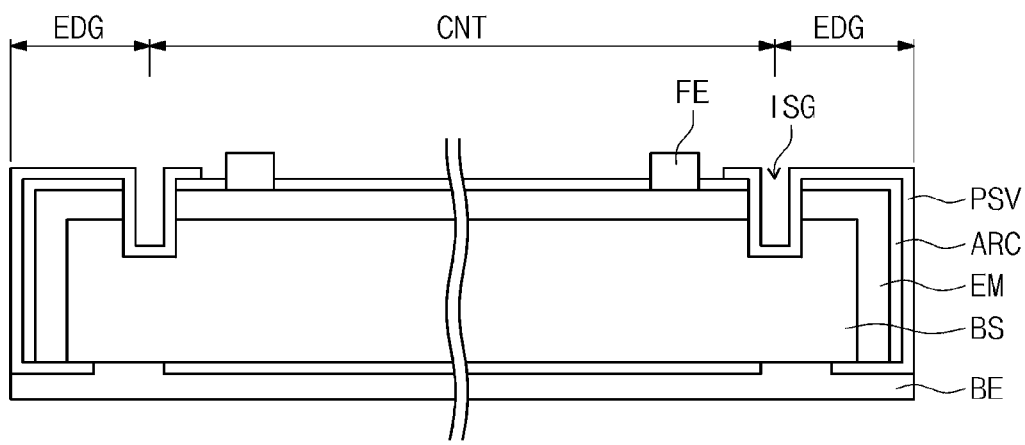

Then, referring to FIG. 2G, the front surface electrode FE contacting the emitter layer EM on the front surface of the base substrate BS, and the back surface electrode BE contacting the back surface of the base substrate BS are formed.

To form the front surface electrode FE, a portion of the anti-reflection layer ARC is removed to expose a portion of the emitter layer EM. The exposed portion of the emitter layer EM is provided with metal paste including metal powder such as sliver, aluminum, and/or silver/aluminum. The metal paste may be printed on the exposed portion of the emitter layer EM. The metal paste is dried for a predetermined time. Then, the base substrate BS provided with the metal paste is cured in a furnace. The dried metal paste is transformed to the front surface electrode FE by the curing.

To form the back surface electrode BE, a portion of the passivation layer PSV is removed to expose a portion of the back surface of the base substrate BS. The exposed portion of the base substrate BS is provided with metal paste including metal powder such as sliver, aluminum, and/or silver/aluminum. The metal paste may be printed on the exposed portion of the base substrate BS. The metal paste is dried for a predetermined time. Then, the base substrate BS provided with the metal paste is cured in a furnace. The dried metal paste is transformed to the back surface electrode BE by the curing. To form the back surface electrode BE, a molten metal from the metal paste melts silicon during the curing, and eutectic layer may be formed through an epitaxial growth from the base substrate BS while being cooled. Accordingly, a back surface field ("BSF") layer containing a high density metal dopant may be formed. The BSF layer reduces back surface recombination of electrons generated by the light.

The front surface electrode FE and the back surface electrode BE may be formed in a single process. Particularly, the metal paste may be formed on the exposed portions of the emitter layer EM and the base substrate BS, respectively, and then, a single curing process may be performed to form the front surface electrode FE and the back surface electrode BE in the same process. The passivation layer PSV stably protects the portion of the emitter layer EM corresponding to the isolation groove ISG during the curing process.

The solar cell fabricated using the method as described above can be formed without a separate etching process for etching the damage region due to laser beams, after the edge isolation process using laser beams. In a typical solar cell fabricating method, a separate etching agent is used to remove a damage region that is molten by the laser beams and hardened. However, in this typical case, the isolation groove ISG is formed before the anti-reflection layer ARC is formed, and although the damage region is removed using the etching agent, a defect may still be present on the emitter layer EM provided with the isolation groove ISG. However, in the solar cell fabricating method according to the illustrated embodiment, when the emitter layer EM is etched, the damage region is completely removed, and thus, physical properties of the solar cell such as a fill factor and optical efficiency are improved.

Figure 3A:
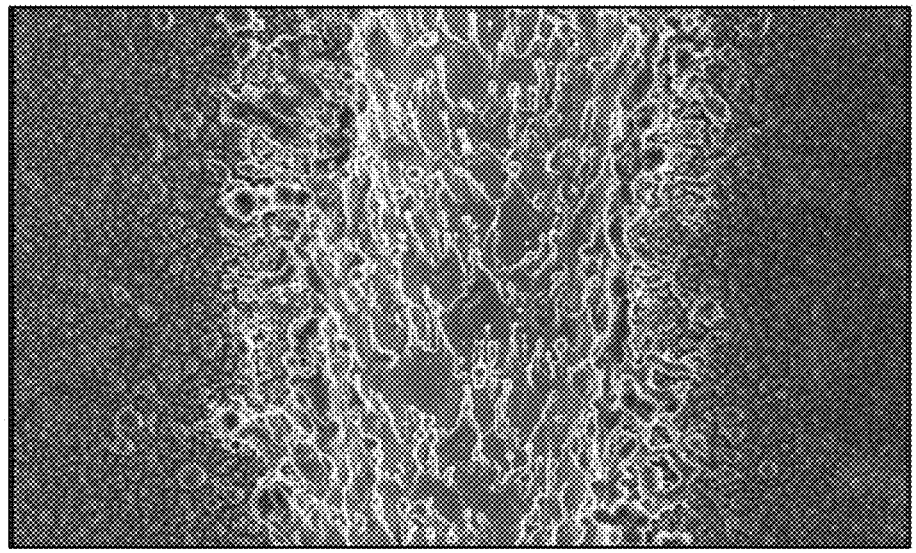
FIG. 3A is an scanning electron microscope ("SEM") image illustrating an isolation groove formed through an edge isolation process, and a dielectric covering the isolation groove, in a typical solar cell.
Figure 3B:
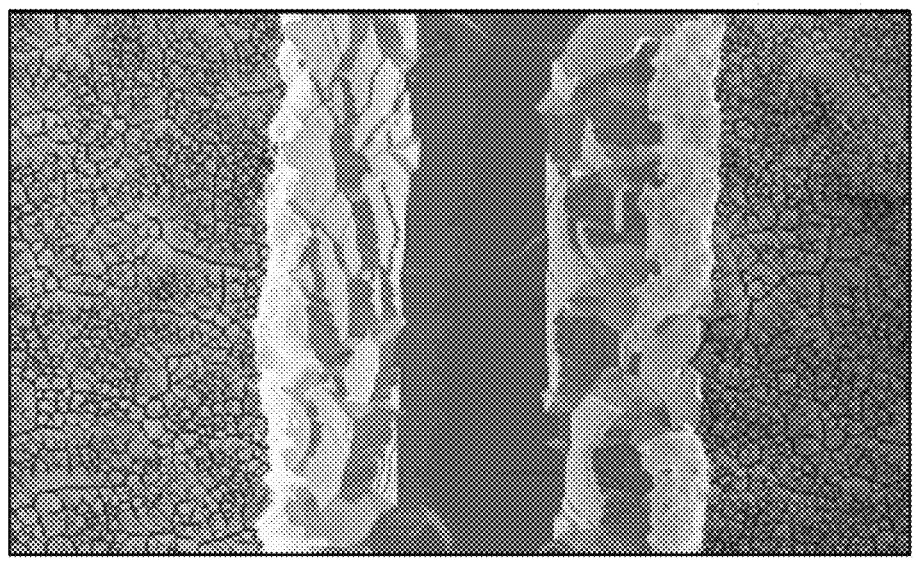
FIG. 3B is an SEM image illustrating an exemplary embodiment of an isolation groove formed through an edge isolation process, and a passivation layer covering the isolation groove, in an exemplary embodiment of a solar cell according to of the invention.

FIG. 3A is a scanning electron microscope ("SEM") image illustrating an isolation groove formed through an edge isolation process, and a dielectric (or an anti-reflection layer) covering the isolation groove, in a typical solar cell. FIG. 3B is an SEM image illustrating an isolation groove formed through an edge isolation process, and a passivation layer covering the isolation groove, in an exemplary embodiment of a solar cell according to the invention.

Referring to FIGS. 3A and 3B, a region corresponding to the isolation groove of the typical solar cell has a convex-concave crystalloid, and thus, a defect rate may be increased. However, a region corresponding to the isolation groove of the exemplary embodiment of the solar cell according to the invention has an even crystalloid, and a portion having a convex-concave crystalloid is completely etched. Thus, according to the exemplary embodiment of the invention, a defect rate of the solar cell can be decreased.

Figure 4:
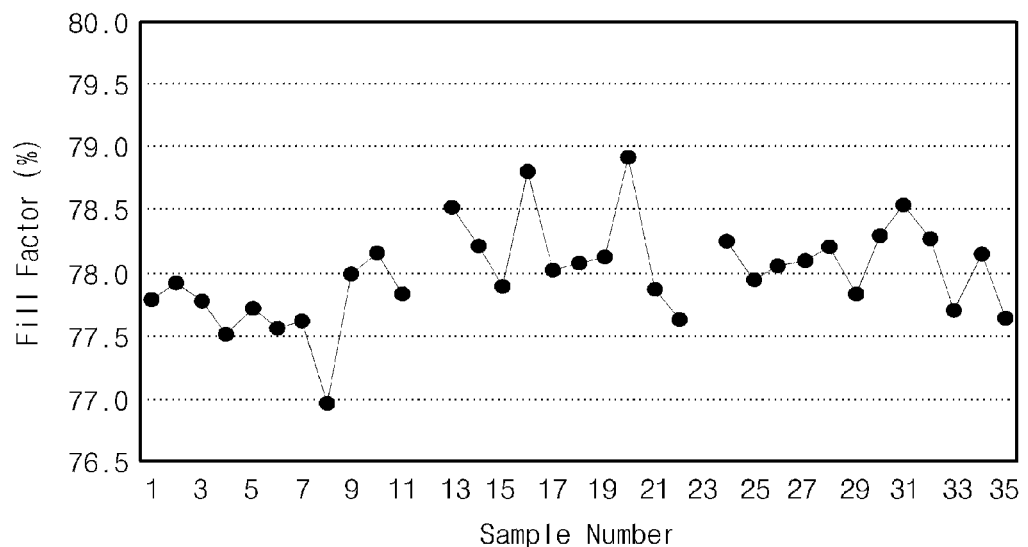
FIG. 4 is a graph illustrating fill factors of typical solar cells, and solar cells according to the invention.

FIG. 4 is a graph illustrating fill factors in percent (%) of typical solar cells and solar cells according to the invention.

Referring to FIG. 4, sample numbers 1 to 11 denote the fill factors of the solar cells fabricated using a typical solar cell fabricating method. Sample numbers 13 to 22 and sample numbers 24 to 35 denote the fill factors of the solar cells fabricated using an exemplary embodiment of a solar cell fabricating method according to the invention.

As illustrated in FIG. 4, a mean value of the fill factors of the solar cells of the exemplary embodiment was greater than that of the fill factors of the typical solar cells.

Figure 5:
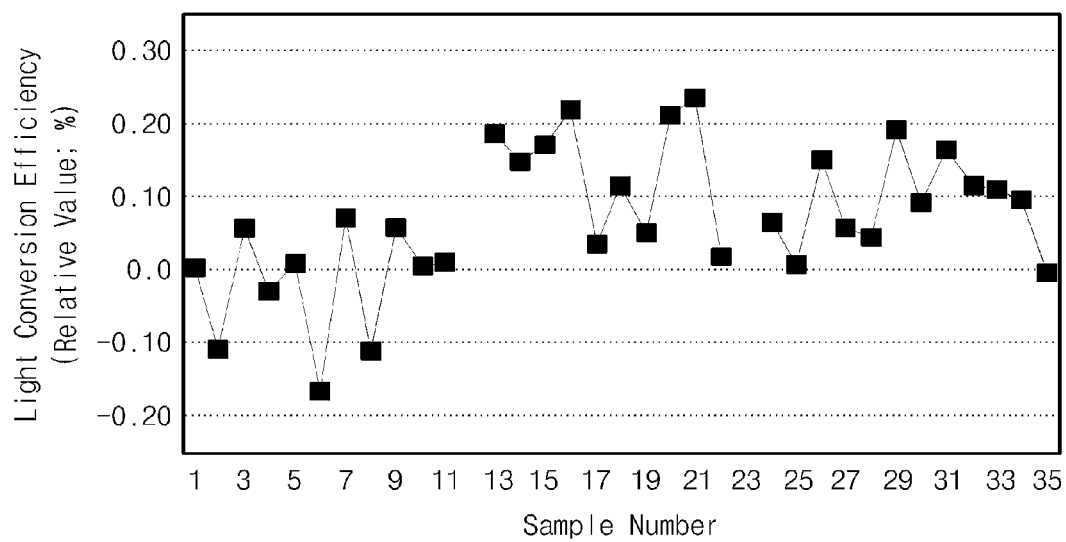
FIG. 5 is a graph illustrating light conversion efficiency of typical solar cells, and solar cells according to the invention.

FIG. 5 is a graph illustrating light conversion efficiency in a relative percent (%) value of typical solar cells and solar cells according to the invention.

Referring to FIG. 5, sample numbers 1 to 11 denote relative values of the light conversion efficiency of the solar cells fabricated using a typical solar cell fabricating method. Sample numbers 13 to 22 and sample numbers 24 to 35 denote relative values of the light conversion efficiency of the solar cells fabricated using an exemplary embodiment of a solar cell fabricating method according to the invention.

As illustrated in FIG. 5, a mean value of light conversion efficiency the solar cells of the exemplary embodiment was greater than that of the light conversion efficiency of the typical solar cells.

Figure 6:
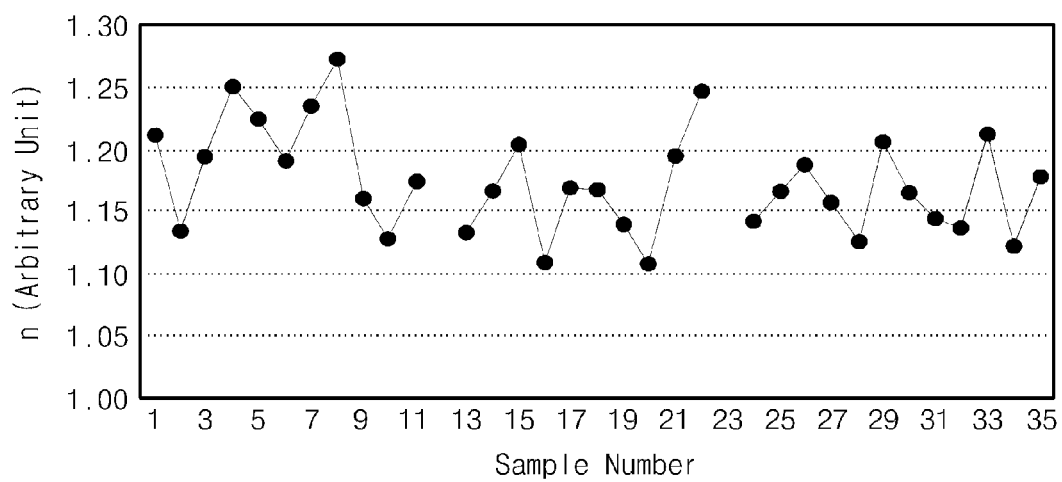
FIG. 6 is a graph illustrating diode ideality factors n of typical solar cells, and solar cells according to the invention.

FIG. 6 is a graph illustrating diode ideality factors (arbitrary unit 'n') of typical solar cells and solar cells according the invention.

Referring to FIG. 6, sample numbers 1 to 11 denote the diode ideality factors n of the solar cells fabricated using a typical solar cell fabricating method. Sample numbers 13 to 22 and sample numbers 24 to 35 denote the diode ideality factors n of the solar cells fabricated using an exemplary embodiment of a solar cell fabricating method according to the invention.

As illustrated in FIG. 6, a mean value of the diode ideality factors n of the solar cells of the exemplary embodiment was closer to 1 as an ideal value, than that of the diode ideality factors n of the typical solar cells was.

As described above, the exemplary embodiments of the solar cells according to the invention are superior to the typical solar cells in a fill factor, light conversion efficiency, and a diode ideality factor.

The exemplary embodiments of the solar cell according to the invention can be fabricated without a separate etching process for removing a damage region generated due to the edge isolation process using laser beams. Accordingly, a solar cell fabricating process is simplified, and a fabricating time is reduced, thereby reducing costs.

In the exemplary embodiment of the solar cell fabricating method according to the invention, when the emitter layer is etched, the damage region due to laser beams is completely removed, and thus, physical properties of the solar cell such as a fill factor and optical efficiency are improved.

The above-disclosed subject matter is to be considered illustrative and not restrictive, and the appended claims are intended to cover all such modifications, enhancements, and other embodiments, which fall within the true spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A method of fabricating a solar cell, the method comprising:
   preparing a substrate of a first conductive type;
   forming an emitter layer of a second conductive type opposite to the first conductive type, on a front surface, and on a back surface opposite the front surface of the substrate;
   forming an anti-reflection layer on the front surface of the substrate;
   partially removing the anti-reflection layer and the emitter layer on the front surface of the substrate, which forms an isolation groove dividing the emitter layer into a plurality of regions;
   removing a portion of the emitter layer formed on the back surface of the substrate; and
   forming a passivation layer in the isolation groove and covering the back surface of the substrate.

2. The method of claim 1, wherein the isolation groove is adjacent to an end of the substrate in a plan view.

3. The method of claim 2, wherein the forming the isolation groove includes shedding laser beams on the anti-reflection layer and the emitter layer, which removes a portion of the anti-reflection layer and a portion of the emitter layer.

4. The method of claim 3, wherein the removing the portion of the emitter layer formed on the back surface of the substrate includes etching using the anti-reflection layer as a mask.

5. The method of claim 4, wherein the etching in the removing the portion of the emitter layer formed on the back surface of the substrate is wet etching.

6. The method of claim 5, wherein the wet etching in the removing the portion of the emitter layer formed on the back surface of the substrate etches a region of the emitter layer on the front surface of the substrate and adjacent to a region on which the laser beams are shed.

7. The method of claim 1, further comprising forming a front surface electrode which contacts a portion of the emitter layer formed, on the front surface of the substrate.

8. The method of claim 7, wherein the forming the front surface electrode comprises:
   removing a portion of the anti-reflection layer, which exposes a portion of the emitter layer;
   forming metal paste on the exposed portion of the emitter layer; and
   curing the substrate including the metal paste, which diffuses a metal of the metal paste.

9. The method of claim 7, further comprising forming a back surface electrode which contacts the back surface of the substrate, on the back surface of the substrate.

10. The method of claim 9, wherein the forming the back surface electrode comprises:
    removing a portion of the passivation layer, which exposes a portion of the back surface of the substrate;
    forming metal paste on the exposed portion of the substrate; and
    curing the substrate, which diffuses a metal of the metal paste.

11. The method of claim 1, wherein the passivation layer comprises at least one of aluminum oxide ($AlO_x$), aluminum nitride (AlN), silicon oxide ($SiO_x$), silicon nitride ($SiN_x$), or silicon oxynitride (SiON).

12. The method of claim 1, further comprising, before the forming the emitter layer, performing a texturing process on the front surface of the substrate, which forms a convex-concave part on the front surface of the substrate.

13. The method of claim 1, wherein the forming the emitter layer includes doping the substrate with an impurity of the second conductive type.

14. The method of claim 13, further comprising removing a dielectric formed in the forming an emitter layer, between the forming an emitter layer and the forming an anti-reflection layer.

* * * * *

UNITED STATES PATENT AND TRADEMARK OFFICE
CERTIFICATE OF CORRECTION

PATENT NO. : 8,647,914 B2  Page 1 of 1
APPLICATION NO. : 13/242787
DATED : February 11, 2014
INVENTOR(S) : Kyoung Jin Seo et al.

It is certified that error appears in the above-identified patent and that said Letters Patent is hereby corrected as shown below:

On the Title Page

(73) Assignees:     Delete "Samsung Display Co., Ltd., Yongin-si (KR)"

Signed and Sealed this
Fifteenth Day of April, 2014

Michelle K. Lee
*Deputy Director of the United States Patent and Trademark Office*